United States Patent
Pendharkar et al.

(10) Patent No.: US 9,633,849 B2
(45) Date of Patent: *Apr. 25, 2017

(54) IMPLANT PROFILING WITH RESIST

(71) Applicant: Texas Instruments Incorporated, Dallas, TX (US)

(72) Inventors: Sameer P. Pendharkar, Allen, TX (US); Binghua Hu, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/093,867

(22) Filed: Apr. 8, 2016

(65) Prior Publication Data
US 2016/0225672 A1  Aug. 4, 2016

Related U.S. Application Data

(63) Continuation of application No. 14/575,457, filed on Dec. 18, 2014, now Pat. No. 9,337,106.

(60) Provisional application No. 61/921,788, filed on Dec. 30, 2013.

(51) Int. Cl.
| | |
|---|---|
| H01L 21/425 | (2006.01) |
| H01L 21/70 | (2006.01) |
| H01L 21/027 | (2006.01) |
| H01L 21/266 | (2006.01) |
| H01L 21/426 | (2006.01) |
| H01L 21/02 | (2006.01) |
| H01L 21/32 | (2006.01) |
| H01L 21/8234 | (2006.01) |
| H01L 29/66 | (2006.01) |
| H01L 29/78 | (2006.01) |

(52) U.S. Cl.
CPC ...... *H01L 21/0274* (2013.01); *H01L 21/0271* (2013.01); *H01L 21/02694* (2013.01); *H01L 21/266* (2013.01); *H01L 21/32* (2013.01); *H01L 21/426* (2013.01); *H01L 21/823493* (2013.01); *H01L 29/66575* (2013.01); *H01L 29/66659* (2013.01); *H01L 29/6659* (2013.01); *H01L 29/7833* (2013.01); *H01L 29/7835* (2013.01)

(58) Field of Classification Search
CPC .............................. H01L 21/32; H01L 21/266
USPC ................. 438/519–531, 298–308, 217; 257/391–400, 409
See application file for complete search history.

(56) References Cited

U.S. PATENT DOCUMENTS

| | | |
|---|---|---|
| 5,405,788 A | 4/1995 | Manning et al. |
| 6,448,125 B1 | 9/2002 | Patti et al. |
| 8,629,523 B2 * | 1/2014 | Shih ................ H01L 27/14629 257/432 |

(Continued)

*Primary Examiner* — Calvin Lee
(74) *Attorney, Agent, or Firm* — Jacqueline J. Garner; Charles A. Brill; Frank D. Cimino

(57) ABSTRACT

A process for forming at least two different doping levels at the surface of a wafer using one photo resist pattern and implantation process step. A resist layer is developed (but not baked) to form a first resist geometry and a plurality of sublithographic resist geometries. The resist layer is baked causing the sublithographic resist geometries to reflow into a continuous second resist geometry having a thickness less that the first resist geometry. A high energy implant implants dopants through the second resist geometry but not through the first resist geometry. A low energy implant is blocked by both the first and second resist geometries.

9 Claims, 15 Drawing Sheets

(56) References Cited

U.S. PATENT DOCUMENTS 9,337,106 B2 * 5/2016 Pendharkar ............ H01L 21/266
                                                                      438/531

* cited by examiner

IMPLANT PROFILING WITH RESIST

CROSS-REFERENCE TO RELATED APPLICATIONS

This application is a continuation of U.S. Nonprovisional patent application Ser. No. 14/575,457, filed Dec. 18, 2014, now U.S. Pat. No. 9,331,039 issues May 3, 2016, which claims the benefit of U.S. provisional application Ser. No. 61/921,788, filed Dec. 30, 2013, the contents of both of which are herein incorporated by reference in its entirety.

FIELD OF INVENTION

This invention relates to the field of integrated circuits. More particularly, this invention relates to the patterned implantation of dopants in integrated circuits.

BACKGROUND

Integrated circuits have a plurality of electrical devices built on the wafer surface. Some of these devices include transistors, diodes, capacitors, resistors, and diffusions. The doping profile of the integrated circuit wafer underneath two different devices may be identical except for the doping immediately at the surface. The surface doping may be different to provide a different turn on voltage (vt) for two different transistors or to provide a difference in resistance for two different diffused resistors. Typically two separate patterning and implantation steps are required to make even the slightest change in a doping profile.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A process for forming at least two different doping levels at the surface of a wafer using one photo resist pattern and implantation process step. A resist layer is developed (but not baked) to form a first resist geometry and a plurality of sublithographic resist geometries. The resist layer is baked causing the sublithographic resist geometries to reflow into a continuous second resist geometry having a thickness less that the first resist geometry. A high energy implant implants dopants through the second resist geometry but not through the first resist geometry. A low energy implant is blocked by both the first and second geometries.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1A:
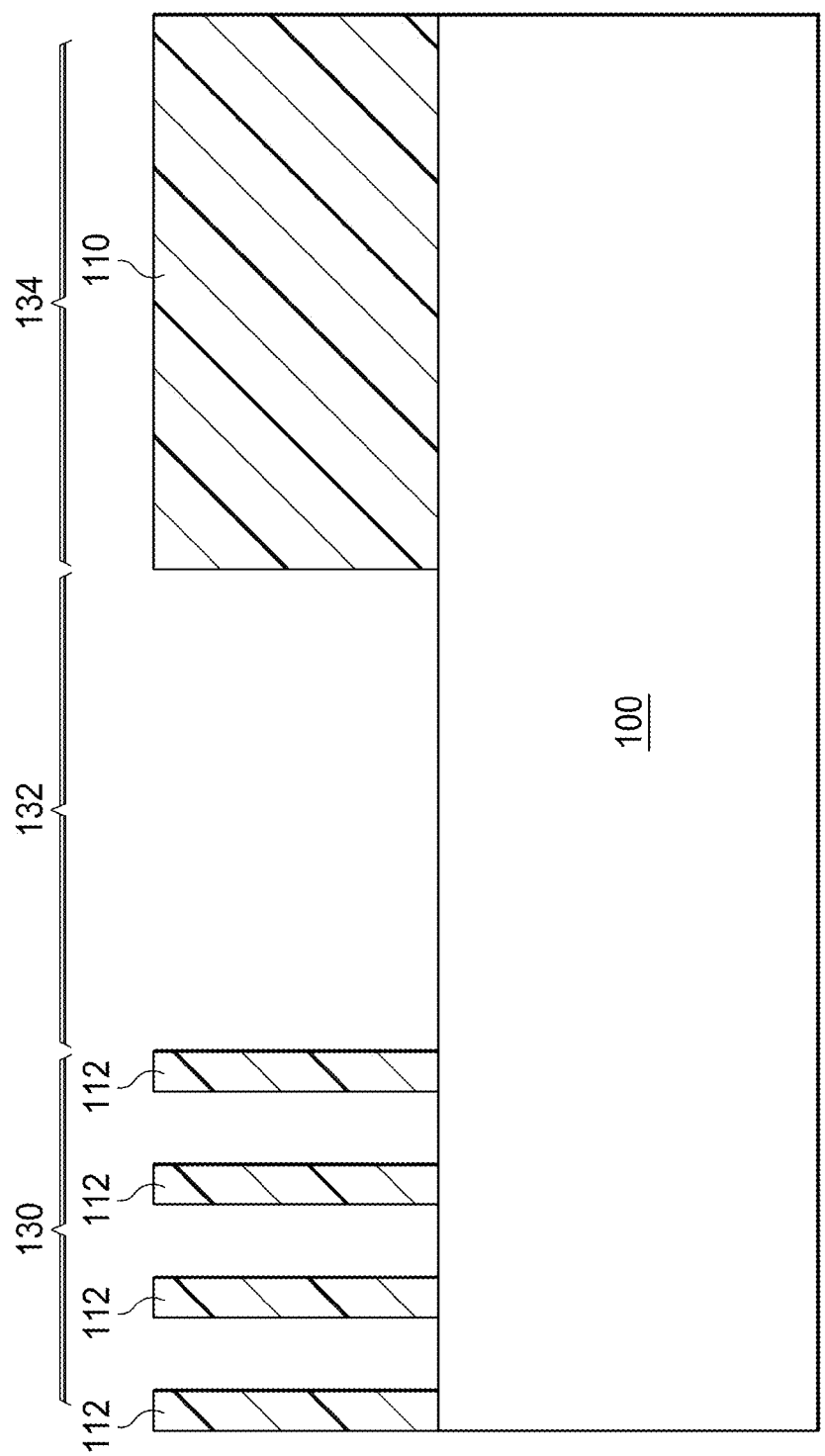
FIGS. 1A-1C are illustrations of steps in the fabrication of integrated circuits formed according to principles of the invention.
Figure 1B:
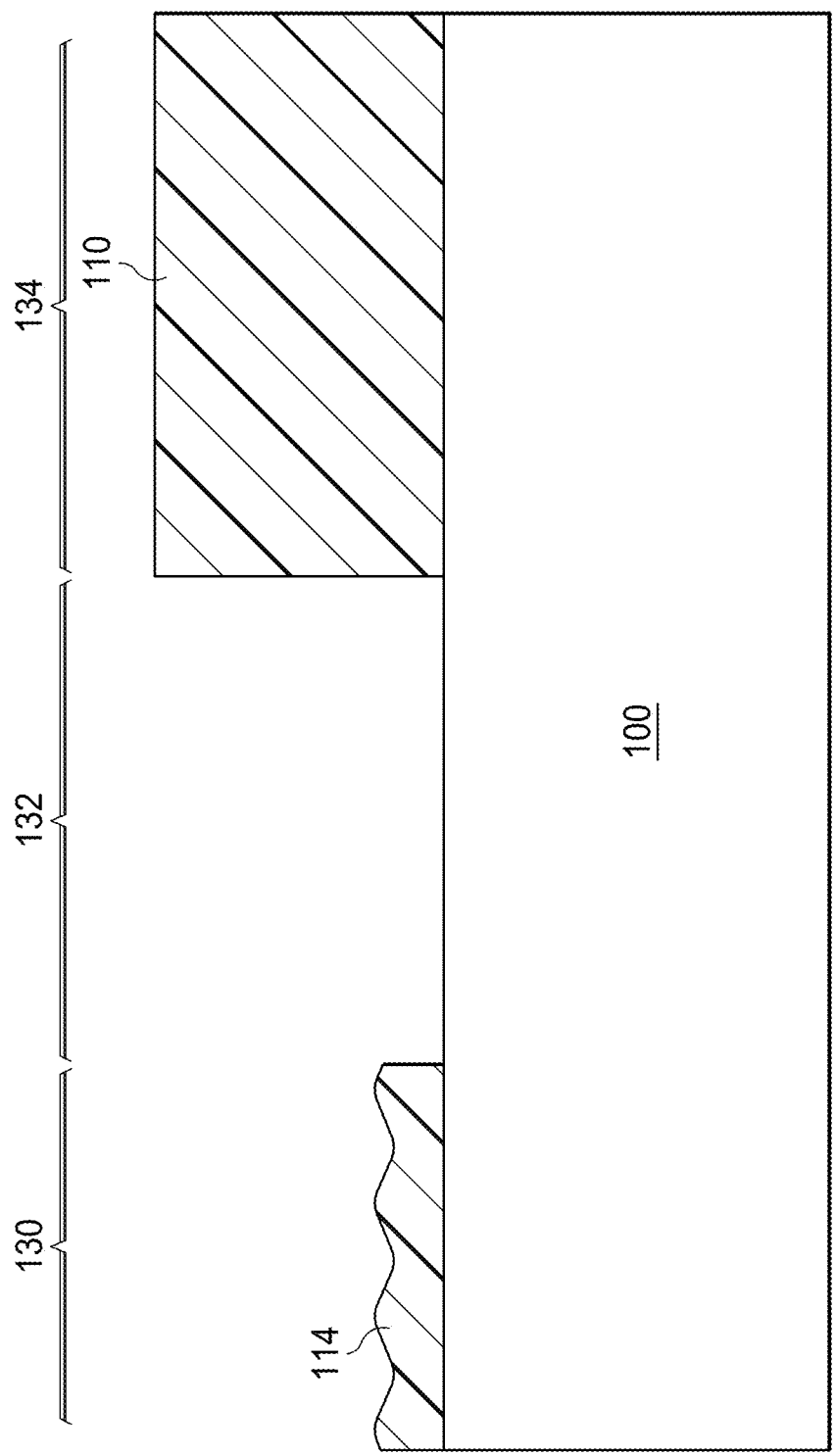
Figure 1C:
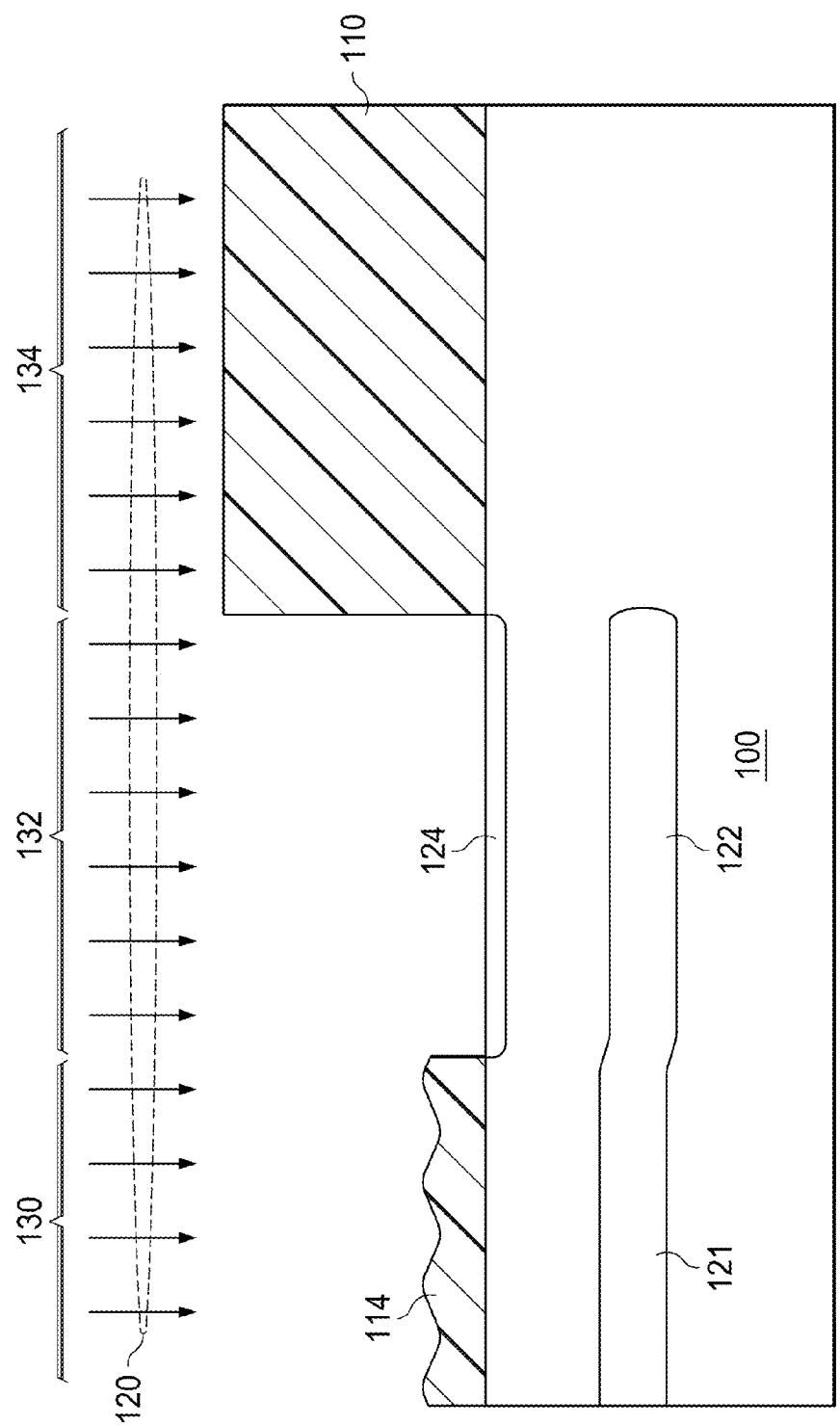
Figure 2A:
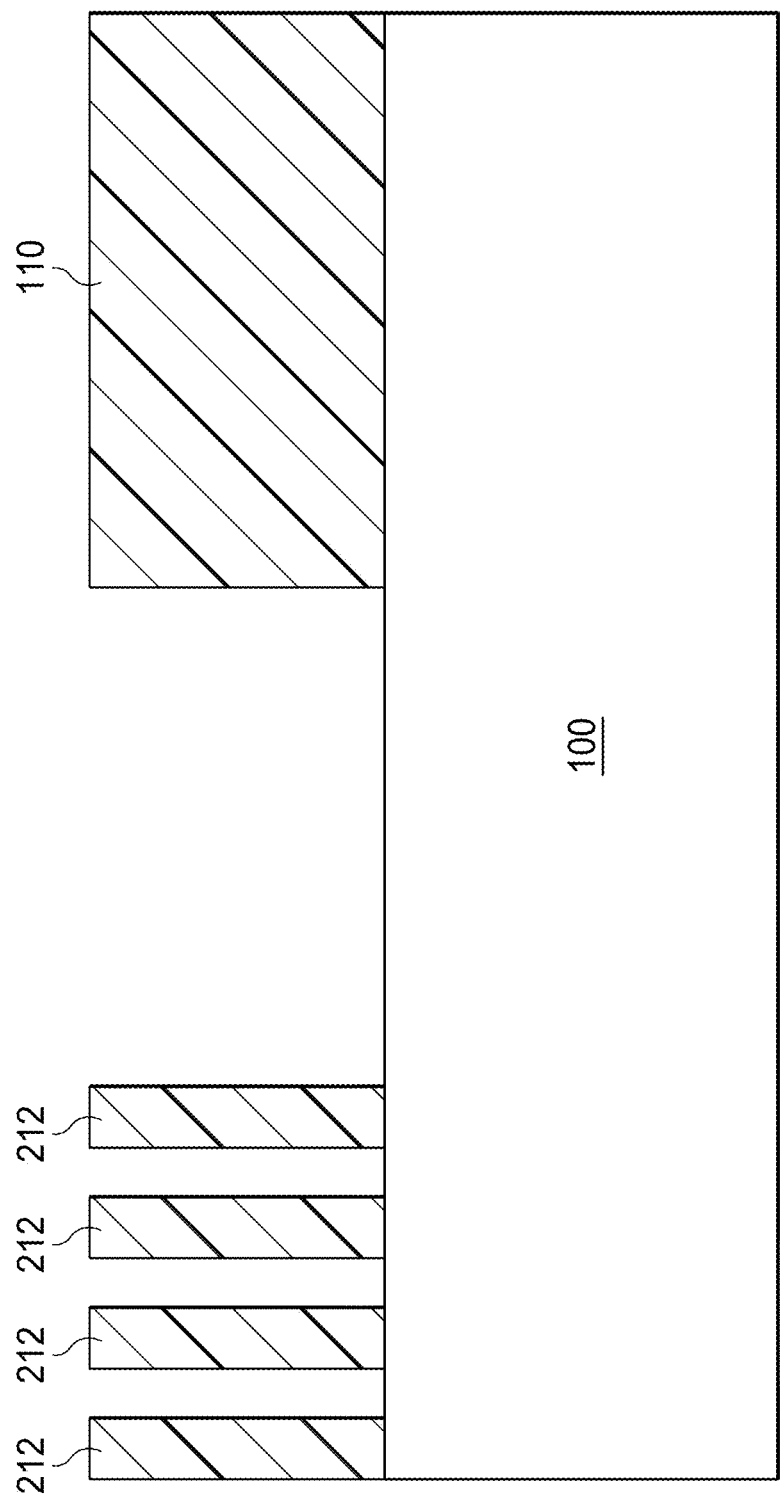
FIGS. 2A-2C are illustrations of steps in the fabrication of integrated circuits formed according to principles of the invention.
Figure 2B:
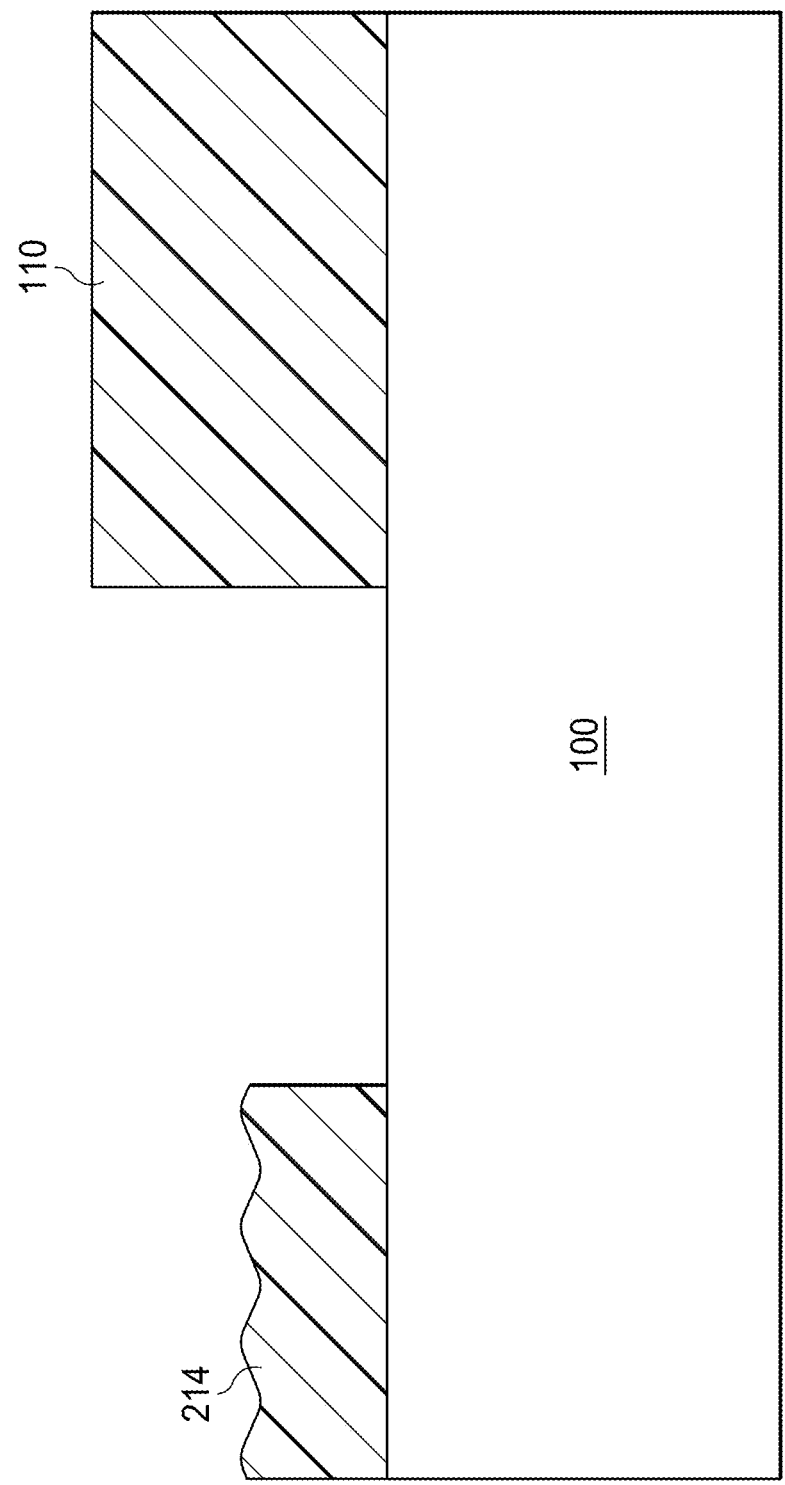
Figure 2C:
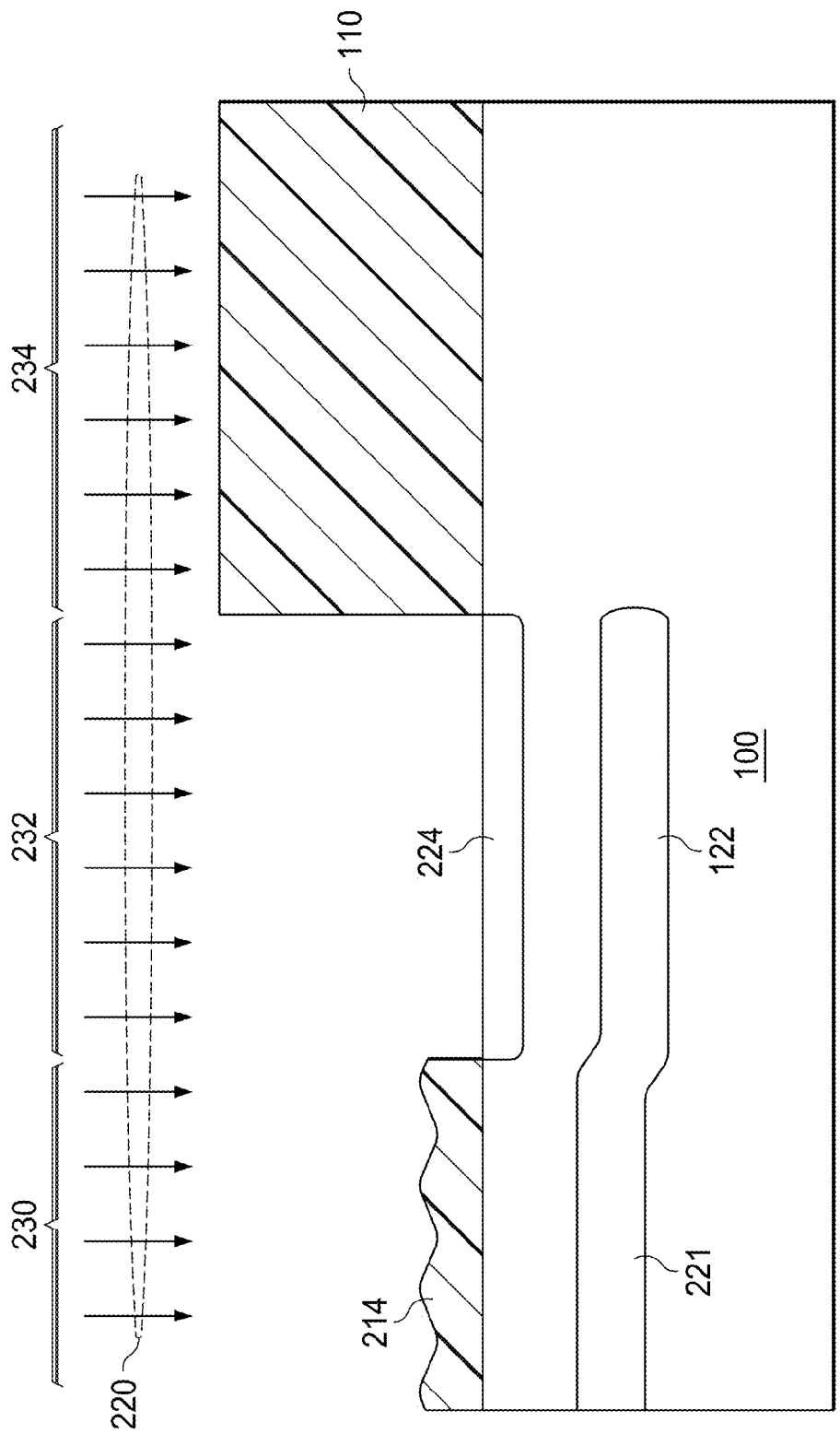

An example process for engineering wafer surface implant profiles with resist patterning is illustrated in FIG. 1A through 1C and in FIG. 2A through 2C.

In FIG. 1A an implant photo resist pattern 110 is formed on the integrated circuit wafer 100. The photoresist pattern 110 is shown after exposure and develop but before bake. A solid block of resist 110 completely blocks the dopant from being implanted into the substrate 100 in region 134 of the wafer. Stripes of resist 112 that are printed using sublithographic width and space design rules cover a portion 130 of the substrate 100 where a low energy implant is to be blocked from the surface of the wafer. An opening with no resist is formed over portion 132 of the substrate 100 which is to receive both a high energy implant deep into the wafer a low energy implant into the surface of the wafer.

The term "sublithographic" means the geometry width and geometry space of the implant photo resist pattern 110 are below the minimum allowed by design rules to print geometries and spaces with high resolution. When sublithographic geometries are printed, the tops of the geometries may be rounded and in extreme cases the sublithographic geometries may not print at all. When sublithographic spaces are printed, residual resist (scumming) may remain at the bottom of the sublithographic spaces and in extreme cases the sublithographic spaces may not print at all. During bake when the bake temperature is above the reflow temperature of the resist, the sublithographic geometries flow into the sublithographic spaces forming a reflowed resist geometry with reduced thickness.

The wafer is shown in FIG. 1B after post develop bake. The bake causes the sublithographic width and space resist geometries 112 to flow together forming a thin layer of reflowed resist 114 over this portion 130 of the wafer. The post develop bake temperature and time depends upon the reflow temperature (glass transition temperature) of the particular resist being used. Typically the post develop bake is performed on a hot plate at a temperature between about 120° C. and 160° C. for a time between 1 and 3 minutes. The post develop bake temperature may be greater than about 10 degrees above the reflow temperature of the photoresist.

Illustrated in FIG. 1C is a chained implant 120 consisting of dopant implanted at high energy to form a deep doped regions 121 and 122 and a low energy implant that dopes the surface 124. The high energy implant penetrates through the reflowed resist 114 and forms deep diffusion 121 in region 130 of the wafer. The high energy implant also forms deep diffusion 122 in the portion of the wafer 132 with no resist. The high energy implant is blocked from implanting into the substrate 100 in region 134 with the thick resist 100.

The low energy implant dopes the surface 124 of the wafer in region 132 where there is no resist but is blocked from implantation into the wafer in region 130 by the reflowed resist 114 and is blocked from implantation into the wafer in region 134 by the thick resist 110.

In one example embodiment, a first transistor with a first turn on voltage (vt) is built in the region 130 of the wafer where the low energy implant is blocked and a second transistor with a second turn on voltage (vt) is built in region 132 where the low energy implant dopes the surface of the wafer.

Figure 3:
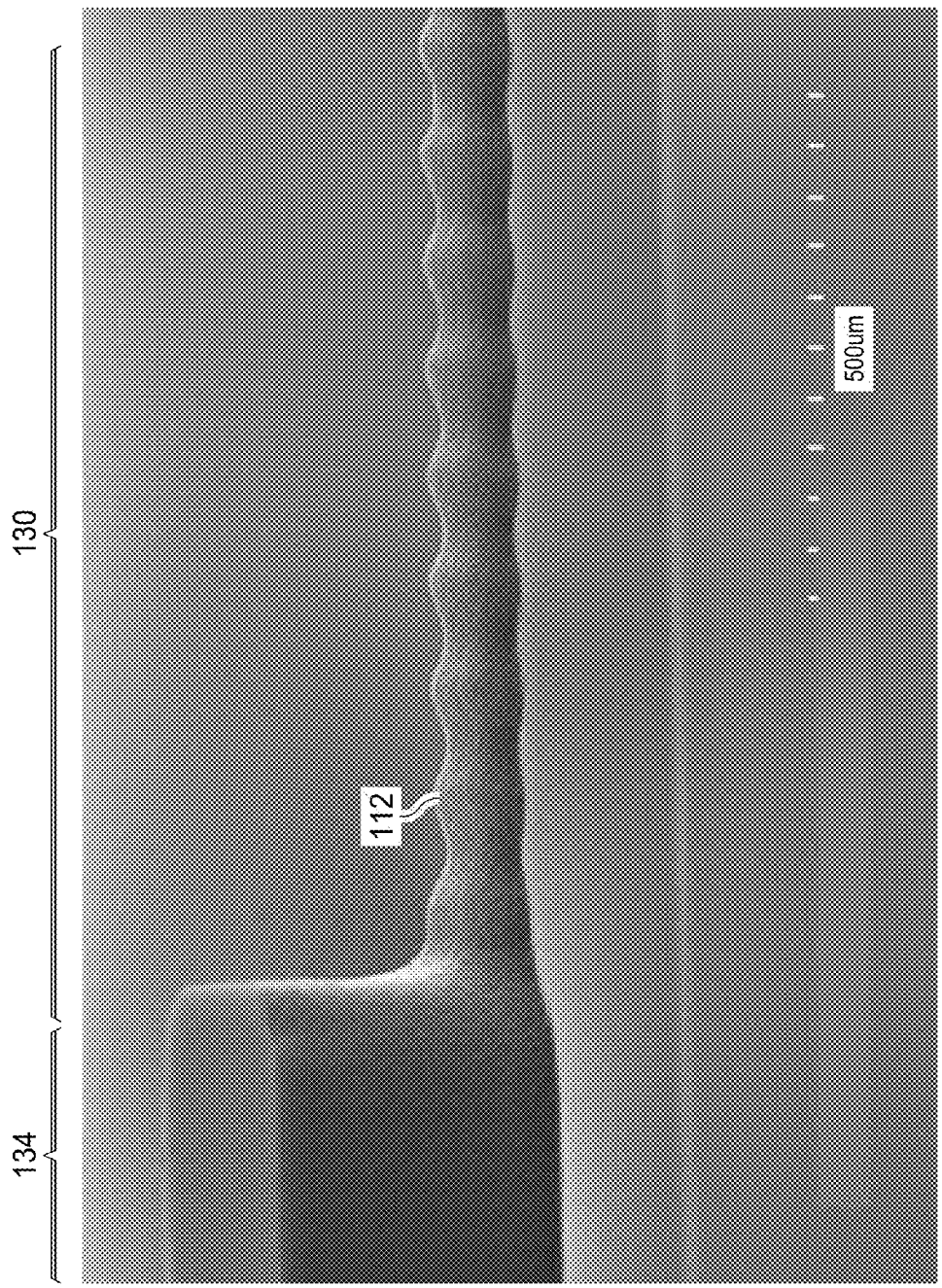
FIG. 3 is an SEM micrograph of a implant blocking photo resist pattern formed according to principles of the invention

FIG. 3 shows an electron microscope view of an example implementation. Thick resist in region 134 blocks all implants. The thin resist in region 130 blocks dopant with low energy from being implanted. Within the thin resist region 134, region 112 is where a sublithographic photo resist geometry is located prior to the resist reflow bake. The resist reflow bake causes the sublithographic geometries 112 and sublithographic spaces to reflow together forming the thin layer of photo resist in region 130.

As illustrated in FIG. 2A through 2C, the size of the sublithographic implant resist geometries 212 and spaces may be varied to control the thickness of the reflowed resist 214 (FIG. 2B) post reflow bake.

The thickness of the reflowed resist 214 may be controlled by changing the size of the sublithographic geometries 212 and spaces. Smaller sublithographic geometries 212 with larger sublithographic spaces lead to thinner reflowed resist 214. As is illustrated in FIG. 2C the thickness of the reflowed resist 214 may be increased to block a higher energy surface implant 220 that forms a deeper surface diffusion 224.

An example process flow which forms a core (medium) vt n-channel metal-oxide-semiconductor (NMOS) and a low vt NMOS (LVNMOS) transistors and forms a core (medium) vt p-channel metal-oxide-semiconductor (PMOS) and low vt PMOS (LVPMOS) transistors using only two vt implant patterning and implantation steps is illustrated in FIGS. 4A through 4E.

Figure 4A:
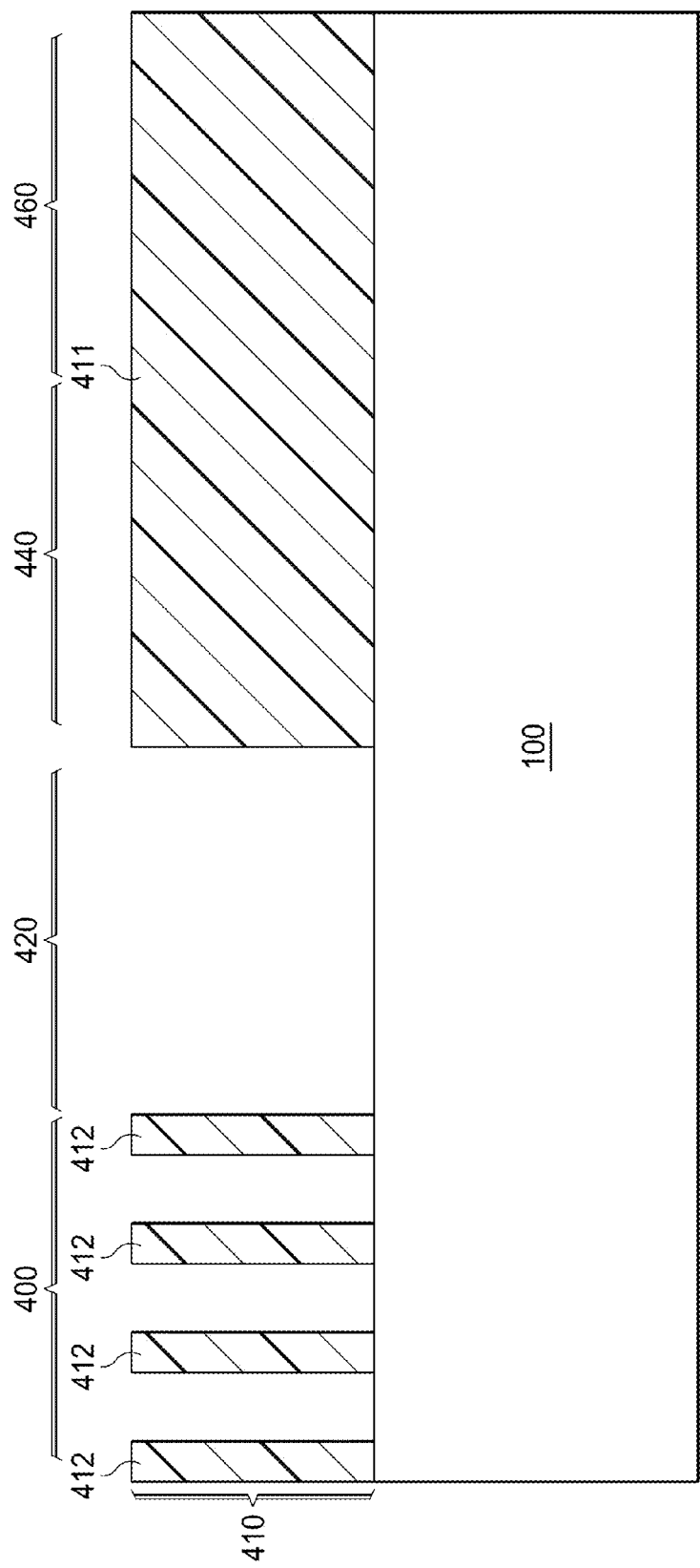
FIGS. 4A-4F are illustrations of steps in the fabrication of integrated circuits formed according to principles of the invention.

An nwell photo resist pattern 410 is formed on the integrated circuit wafer 100 in FIG. 4A. A thick block of resist 411 is formed over regions 440 and 460 where the NMOS transistors are to be formed. Region 420 of the wafer contains no resist geometry so no dopants are blocked in this region. A core PMOS transistor may be built in this area 420. Sublithographic implant resist geometries 412 and spaces are formed on the region 400 of the wafer where a LVPMOS transistor may be built. The nwell photo resist pattern 410 in FIG. 4A is shown after develop and prior to resist bake.

Figure 4B:
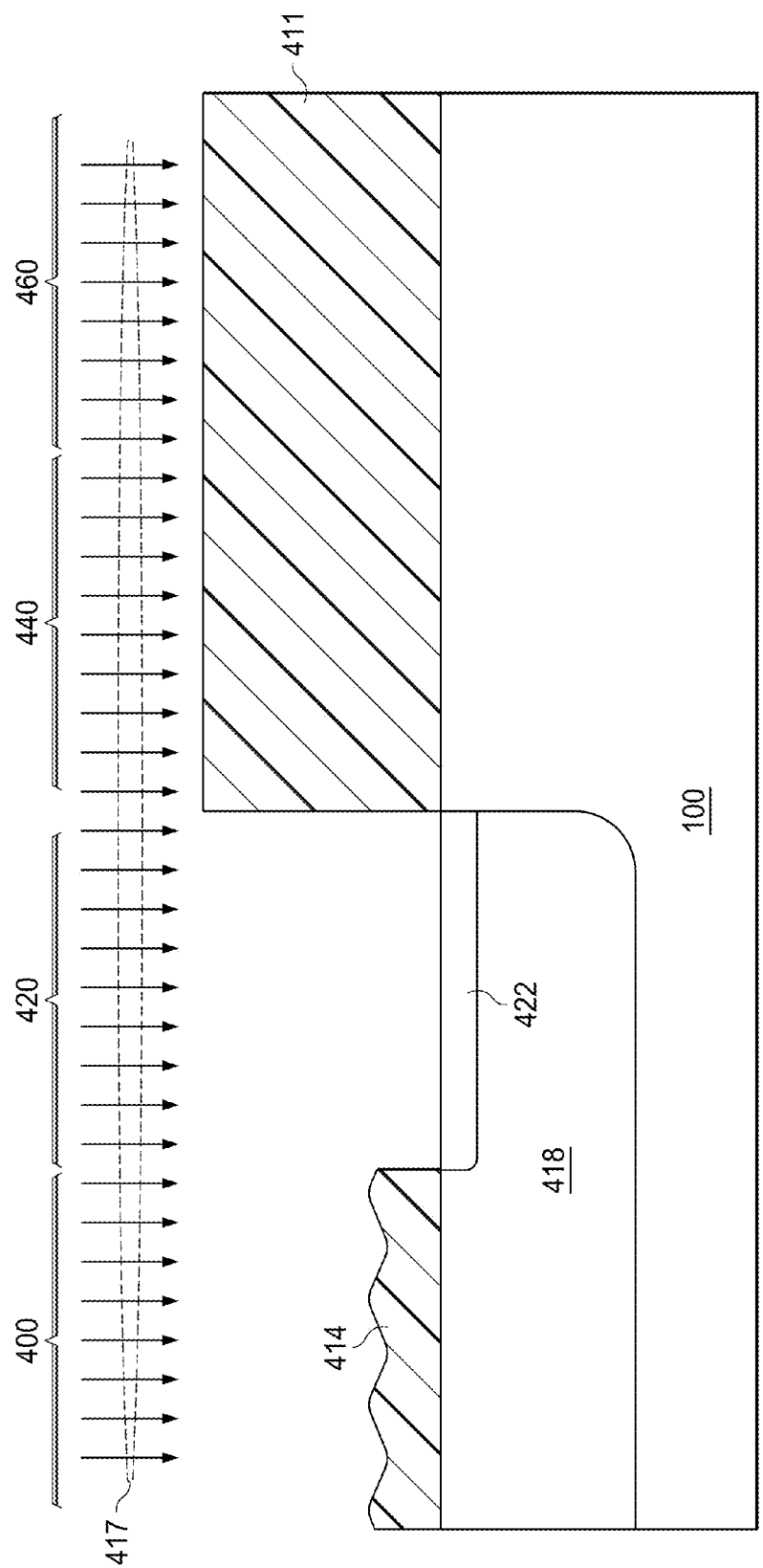

As is illustrated in FIG. 4B, after resist bake the sublithographic nwell photo resist geometries 412 and spaces reflow together to form a continuous layer of photo resist 414 with reduced thickness where the LVPMOS transistor is to be formed.

N-type dopants 416 are then implanted with high energy to form the nwell 418 under regions 400 and 420 where the LVPMOS and PMOS transistors are to be formed. The high energy implant is implanted through the reflowed resist 414 to form the nwell 418 where the LVPMOS transistor is to be formed and into the region 420 without resist where the PMOS transistor is to be formed. The n-type high energy implants 416 are blocked by the thick resist 411 where the NMOS transistors are to be formed.

An n-type implant 417 is then implanted at low energy to increase the doping level 422 of the nwell in the region 420 where the core PMOS transistor is to be formed. The reflowed resist 414 blocks the low energy n-type implant 417 from the region 400 where the LVPMOS transistor is to be formed and the thick resist 410 blocks the low energy n-type implant 417 from the regions 440 and 460 where the NMOS transistors are to be formed.

Alternatively a reflowed resist geometry may be formed over the region 420 where the PMOS transistor is to be formed and a low energy p-type implant may counterdope the nwell 418 in the region 400 to lower the vt where the 1 vt PMOS transistor is to be formed.

Figure 4C:
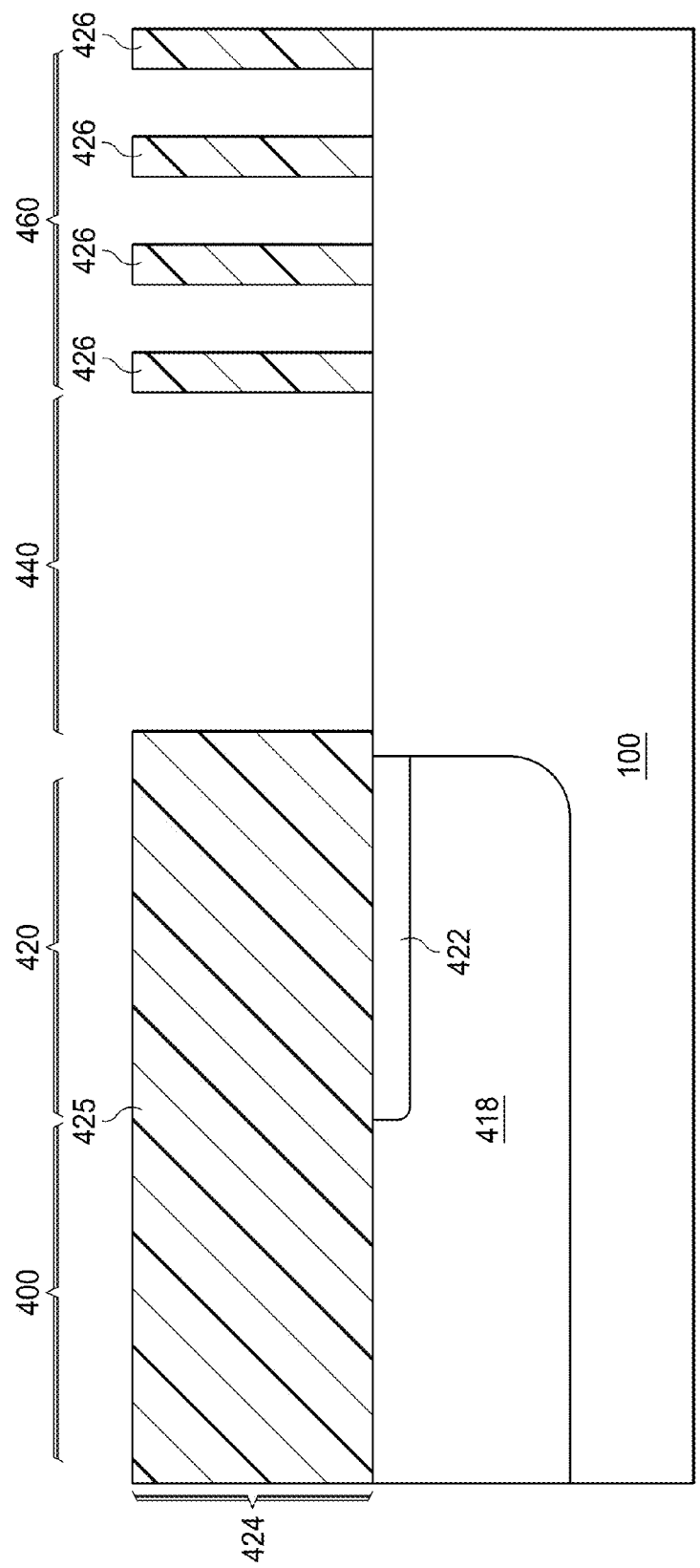

An NMOS transistor vtn photo resist pattern 424 is formed on the wafer in FIG. 4C. A thick resist geometry 425 blocks the NMOS transistor implants from the PMOS transistor areas 400 and 420. The region of the wafer 440 where the core NMOS transistor is to be formed is open. Sublithographic resist geometries 426 and spaces are formed in the region 460 where the LVNMOS transistor is to be formed. The NMOS transistor vtn photo resist pattern 424 in FIG. 4C is shown after exposure and develop and prior to the post develop bake.

Figure 4D:
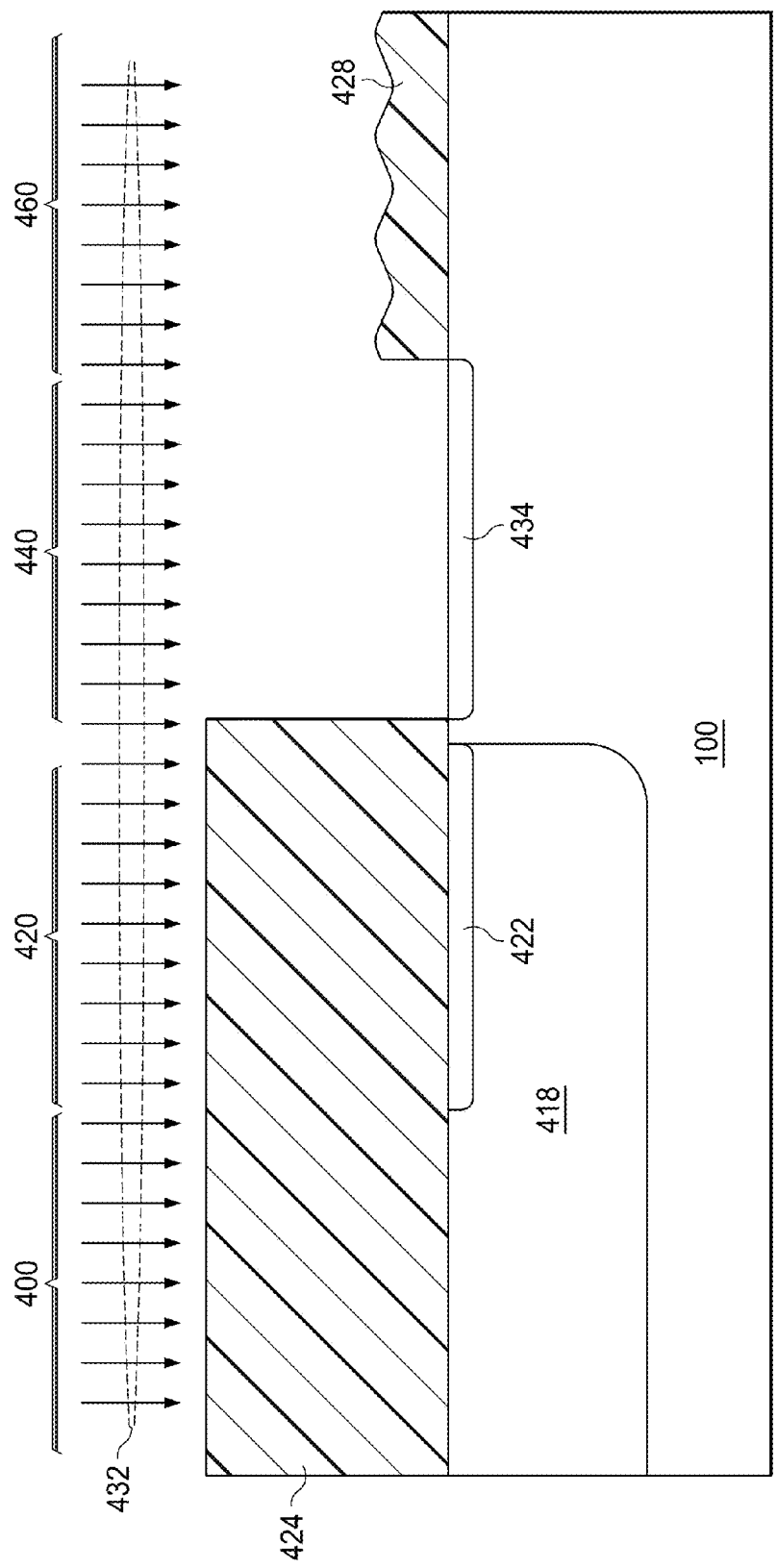

As shown in FIG. 4D, after post develop bake the sublithographic NMOS transistor vtn photo resist geometries 426 and spaces reflow together to form a continuous layer of photo resist 428 with reduced thickness over the region 460 where the LVNMOS transistor is to be formed. The post develop bake temperature and time depends upon the reflow temperature (glass transition temperature) of the particular resist being used. Typically the post develop bake is performed on a hot plate at a temperature between about 120° C. and 160° C. for a time between 1 and 3 minutes. The post develop bake temperature may be greater than about 10 degrees above the reflow temperature of the photoresist.

A low energy p-type implant 432 is implanted to raise the doping at the surface of the wafer where the core NMOS transistor 440 is to be formed to set the core NMOS vtn. The low energy p-type implant 432 is blocked by the reflowed resist geometry 428 in the region 460 where the LVNMOS transistor is to be formed. The implant 432 is blocked by the thick resist 424 from where 400 and 420 the PMOS transistors are to be formed.

Figure 4E:
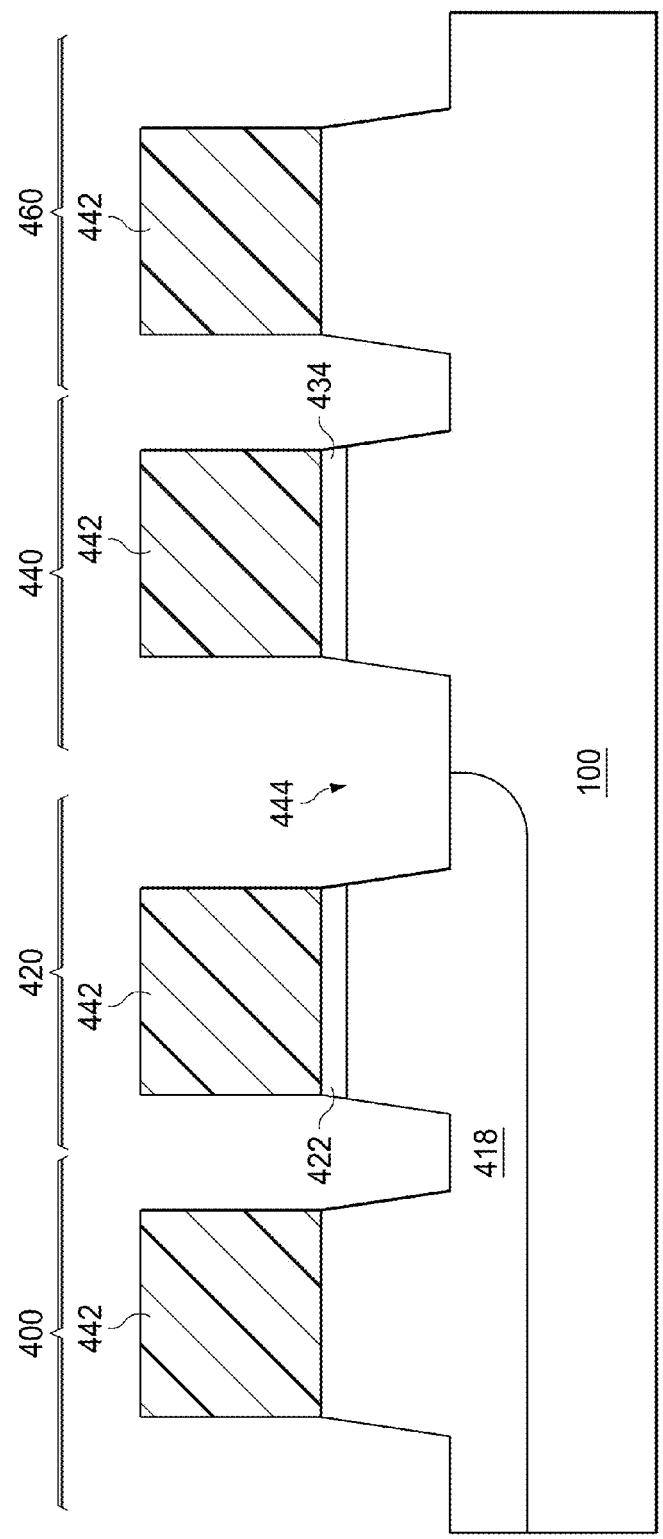

As shown in FIG. 4E, an active photo resist pattern 442 may then be formed on the wafer and shallow trench isolation (STI) trenches 444 etched into the substrate 110 to electrically isolate the transistors.

Figure 4F:
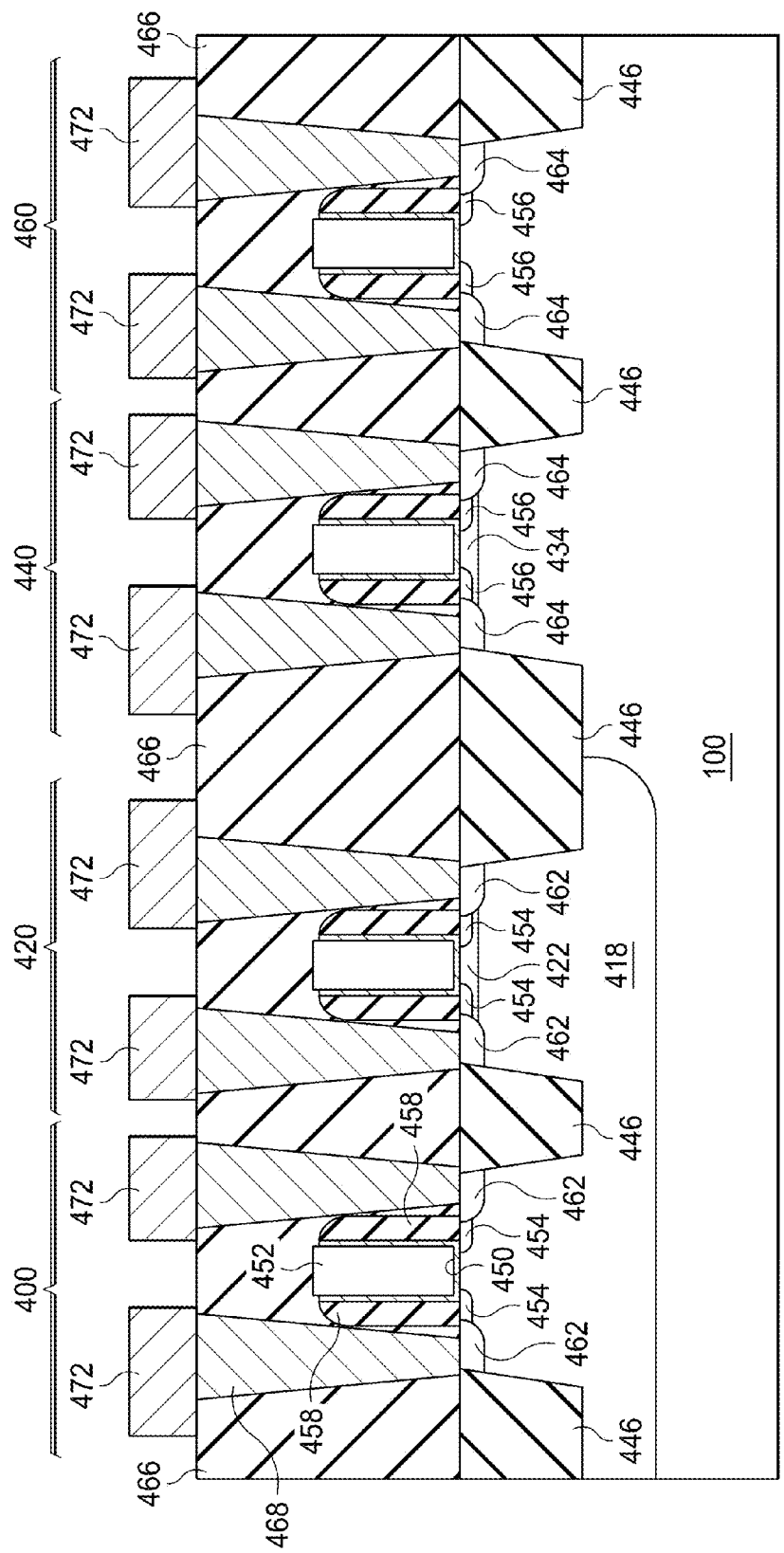

The integrated circuit is then processed using conventional processing steps to complete the integrated circuit. The integrated circuit processed through a first level of interconnect is shown in FIG. 4F. STI trenches 444 are filled with STI dielectric 446 to electrically isolate the transistors, 400, 420, 440, and 460 from each other. Transistor gates 452 are formed on a gate dielectric 450. Source and drain extensions 454 and 456 are formed self-aligned to the transistor gates 452 in the usual manner. Dielectric sidewalls 458 are then formed on the transistor gates 452 and deep source and drain diffusions 462 and 464 are implanted self-aligned to the dielectric sidewalls 458. Premetal dielectric (PMD) 466 is formed over the transistors and planarized using chemical mechanical polish (CMP). Contact plugs 468 are formed through the PMD to electrically connect the gates 452 and the deep source and drain diffusions 462 and 464 to a first level of interconnect 472. Additional levels of dielectric and interconnect may be formed on the integrated circuit to complete manufacturing.

Although transistors are used for illustration, any two devices whose doping profiles differ only at the wafer surface may be formed using these embodiment techniques. Additionally, one device with two regions whose dopant profiles are identical except for the surface doping may also be used. An example device with two differently doped surface regions may be a drain extended NMOS (DENMOS) transistor such as is shown in FIG. 5.

Figure 5:
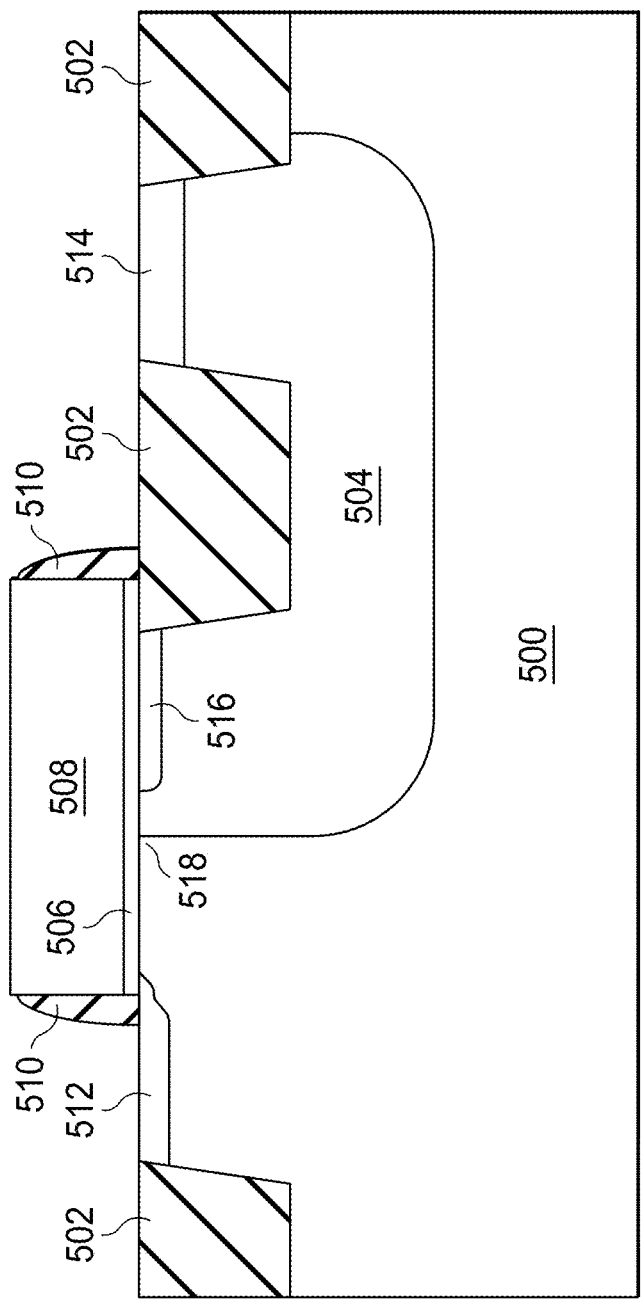
FIG. 5 is an illustration of a DEMOS transistor formed according to principles of the invention

The source of the DENMOS transistor illustrated in FIG. 5 is heavily doped n-type diffusion 512 and the drain is the lightly doped extended drain region 504 and the heavily doped n-type diffusion 514. When a high voltage is applied to the heavily doped drain diffusion 514 the lightly doped extended drain region 504 fully depletes. Sufficient voltage is dropped across the depleted lightly doped drain region 504 so that the gate dielectric 506 of a low voltage transistor may be used for the DENMOS transistor. The performance of the DENMOS transistor may be improved by forming a reduced resistance region 516 in the lightly doped drain. This higher doped, reduced resistance region 516 is kept away from the edge 518 of the lightly doped drain that is under the DENMOS gate 508 to prevent reduction in the breakdown voltage. Typically an extra pattern and implantation step is required to accomplish this.

Figure 6:
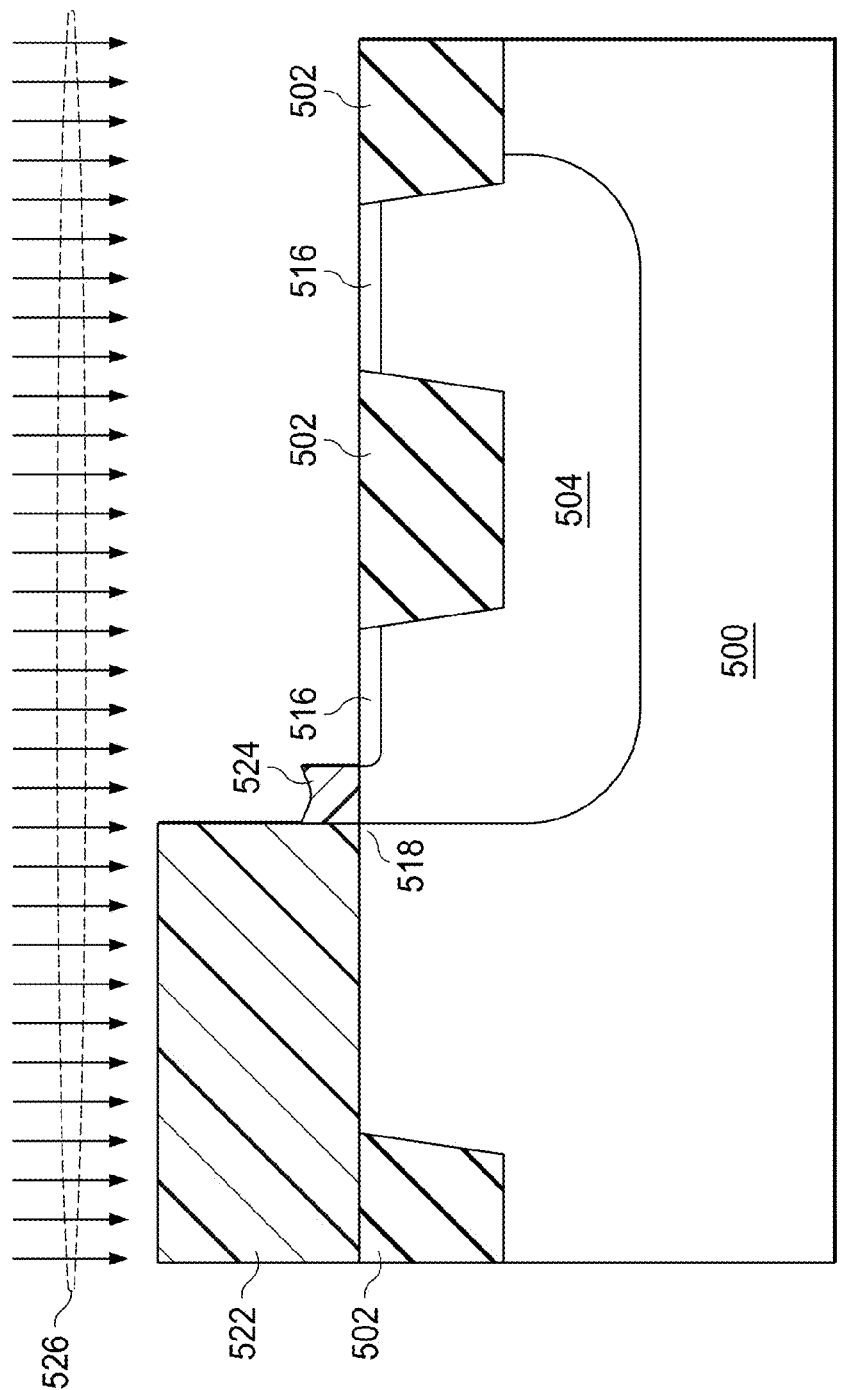
FIG. 6 illustrates the major step in the fabrication of the DEMOS transistor in FIG. 5.

As is illustrated, in FIG. 6, a resist geometry 524 with reduced thickness formed by printing sublithographic geometries and spaces when forming the lightly doped drain implant pattern 522 may be used to form the reduced resistance diffusion 516 with no additional patterning and implantation steps. A high energy implant is implanted through the sublithographic resist geometry 524 and into the region with no resist to form the lightly doped extended drain 504. A low energy implant gets blocked by the sublithographic resist geometry 524 near the boundary of the lightly doped drain so the breakdown voltage of the DENMOS transistor is not degraded. The dopant 516 is implanted at low energy into the lightly doped extended drain 504 region with no resist to form the reduced resistance diffusion 516.

Those skilled in the art to which this invention relates will appreciate that many other embodiments and variations are possible within the scope of the claimed invention.

What is claimed is:

1. A process of forming an integrated circuit, comprising the steps:
   forming a photoresist layer over a wafer of the integrated circuit;
   developing the photoresist layer to form a first photoresist implant blocking geometry on a wafer of the integrated circuit with a greater than or equal to minimum design rule width and with a first thickness and to form a plurality of sublithographic photoresist geometries and a plurality of sublithographic spaces between the sublithographic photoresist geometries on the wafer;
   without first baking the photoresist layer at a lower temperature than the reflow temperature of the photoresist, performing a post develop bake at a temperature greater than the reflow temperature of the photoresist causing the sublithographic photoresist geometries and sublithographic spaces to reflow forming a second photoresist implant blocking geometry with a thickness that is less than the first thickness;
   implanting a first dopant with a high implant energy wherein the first dopant implant is blocked by the first photoresist implant blocking geometry, is implanted into the wafer through the second resist implant blocking geometry, and is implanted into the wafer where there is no photoresist geometry; and
   implanting a second dopant with a low energy wherein the second dopant implant is blocked by the first photoresist implant blocking geometry, is blocked by the second photoresist implant blocking geometry, and is implanted into the wafer where there is no photoresist geometry.

2. The process of claim 1, wherein the post develop bake is in a temperature range of 100° C. to 160° C. and for a time in the range of 60 sec to 180 sec.

3. The process of claim 1, wherein the post develop bake is performed at a temperature greater than 10 degrees above the reflow temperature of the photo resist.

4. The process of claim 1, wherein the first implant forms a well under the second photoresist implant blocking geometry and forms a well in the wafer where there is no photoresist geometry and wherein the second implant dopes the surface of the wafer where there is no photoresist geometry and is blocked from doping the surface by the first and the second photoresist implant blocking geometries.

5. The process of claim 4, wherein the first implant forms an nwell, wherein a first PMOS transistor with a first turn on voltage is formed in the nwell where there is no photoresist geometry, and wherein a second PMOS transistor with a second turn on voltage is formed in the nwell with the second photoresist implant blocking geometry.

6. The process of claim 4, wherein the first implant forms a pwell and wherein a first NMOS transistor with a first turn on voltage is formed in the pwell where there is no photoresist geometry and wherein a second NMOS transistor with a second turn on voltage is formed in the pwell with the second photoresist implant blocking geometry.

7. The process of claim 1, wherein the second photoresist implant blocking geometry adjoins the first photoresist implant blocking geometry next an opening on the wafer with no photoresist geometry and wherein the first implant forms a lightly doped extended drain of a DEMOS transistor under the second photoresist implant blocking geometry and in the opening and wherein the second implant forms a reduced resistance diffusion in the lightly doped extended drain and wherein the second implant is blocked from the border of the lightly doped extended drain under a gate of the DEMOS transistor.

8. The process of claim 7, wherein the lightly doped extended drain is p-type and the DEMOS transistor is a DEPMOS transistor.

9. The process of claim 7, wherein the lightly doped extended drain is n-type and the DEMOS transistor is DENMOS.

* * * * *